(12) United States Patent
Bates

(10) Patent No.: US 7,378,903 B2
(45) Date of Patent: May 27, 2008

(54) SYSTEM AND METHOD FOR MINIMIZING DC OFFSET IN OUTPUTS OF AUDIO POWER AMPLIFIERS

(75) Inventor: L. Dexter Bates, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 763 days.

(21) Appl. No.: 10/862,902

(22) Filed: Jun. 7, 2004

(65) Prior Publication Data

US 2007/0222504 A1    Sep. 27, 2007

(51) Int. Cl.
*H03F 1/02* (2006.01)
(52) U.S. Cl. .......................... 330/9; 327/333; 330/10; 330/251; 330/207 A
(58) Field of Classification Search ................ 330/10, 330/207 A, 251; 327/333
See application file for complete search history.

(56) References Cited

U.S. PATENT DOCUMENTS 6,388,514 B1 *    5/2002    King et al. ............... 330/10

* cited by examiner

*Primary Examiner*—Robert J. Pascal
*Assistant Examiner*—Hieu Nguyen
(74) *Attorney, Agent, or Firm*—Carr & Ferrell LLP

(57) ABSTRACT

An amplifier system receives an input signal and generating therefrom an amplified output signal. The amplifier system is recited as comprising an input stage and an amplifier stage. The input stage is configured to receive the input signal and provide a level-shifted signal that has an average signal level that is shifted in regards a level shift value. The amplifier stage is configured to receive the level-shifted input signal from the input stage and generate therefrom the amplified output signal. The level shift value being selected to minimize a DC offset in the amplified output signal at least when the amplifier system is initially powered on. Since the amplified output signal has a minimal or zero DC offset, the amplifier system avoids generation of undesirable noises when it is initially powered on.

31 Claims, 6 Drawing Sheets

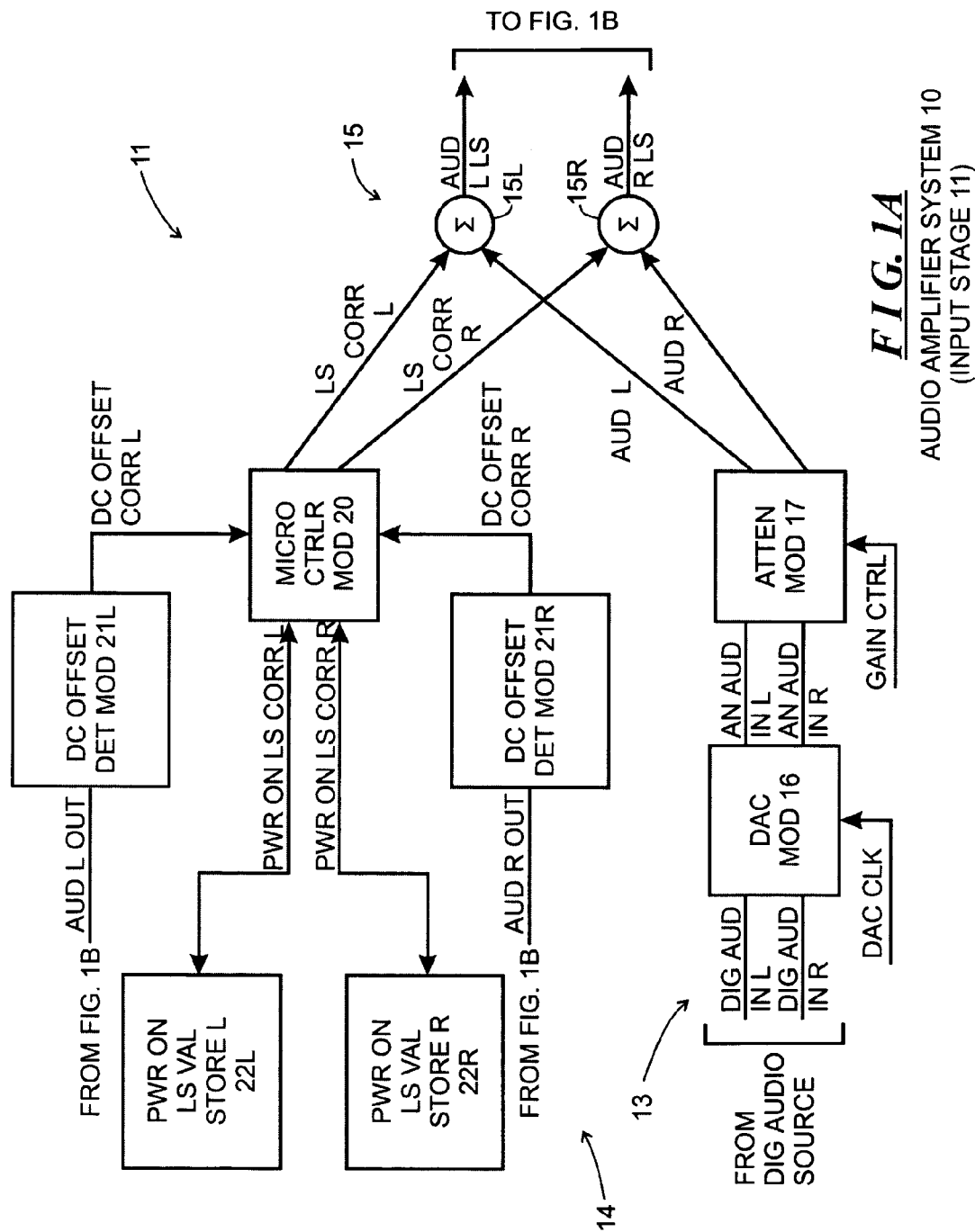

AUDIO AMPLIFIER SYSTEM 10
(POWER AMPLIFIER STAGE 12)

```
┌─────────────────────────────────────────────┐
│ 100. INITIALIZE THE POWER-ON LEVEL SHIFT    │
│ VALUE BY INITIALIZING THE BITS IN THE BIT   │
│ POSITIONS B_MSB...B_0 TO THE VALUE TO ZERO  │
└─────────────────────────────────────────────┘
                      │
                      ▼
┌─────────────────────────────────────────────┐
│ 101 INITIALIZE THE VALUE OF AN ITERATION    │
│ COUNTER "i" TO "MSB"                        │
└─────────────────────────────────────────────┘
                      │
                      ▼
┌─────────────────────────────────────────────┐
│ 102. INITIALIZE THE VALUE OF A CURRENT      │
│ VOLTAGE RANGE LEVEL INDICATOR AT 1/2        │
└─────────────────────────────────────────────┘
                      │
                      ▼
┌─────────────────────────────────────────────┐
│ 103. SET THE VOLTAGE LEVEL OF THE LS_CORR_L │
│ LEFT CHANNEL LEVEL SHIFT CORRECTION SIGNAL  │◄── B
│ AT A POINT IN ITS VOLTAGE RANGE INDICATED   │
│ BY THE VALUE OF THE CURRENT VOLTAGE RANGE   │
│ LEVEL INDICATOR                             │
└─────────────────────────────────────────────┘
                      │
                      ▼
┌─────────────────────────────────────────────┐
│ 104. WAIT A SELECTED TIME PERIOD, TO ALLOW  │
│ THE DC_OFFSET_CORR_L LEFT CHANNEL DC OFFSET │
│ CORRECTION SIGNAL TO STABILIZE              │
└─────────────────────────────────────────────┘
                      │
                      ▼
┌─────────────────────────────────────────────┐
│ 105. DETERMINE WHETHER THE DC_OFFSET_CORR_L │── NO ──► A
│ SIGNAL IS NEGATED                           │
└─────────────────────────────────────────────┘
                      │
                     YES
                      │
                      ▼
┌─────────────────────────────────────────────┐
│ 106. SET THE BIT IN BIT POSITION BI TO "ONE"│
└─────────────────────────────────────────────┘
                      │
                      ▼
                     (A)
```

*FIG. 4*

SYSTEM AND METHOD FOR MINIMIZING DC OFFSET IN OUTPUTS OF AUDIO POWER AMPLIFIERS

FIELD OF THE INVENTION

The invention relates generally to the field of audio power amplifiers, and more particularly to the field of systems and methods for minimizing a direct current ("DC") offset in the output of class-D audio power amplifiers.

BACKGROUND OF THE INVENTION

A number of types of audio power amplifier designs have been developed, which have been grouped into various classes. Amplifiers in several classes, namely, class-A, class-B, class-AB and class-C, are referred to as linear power amplifiers, since the output signals generated by the amplifiers bear a generally linear relation to the input signal. Amplifiers in these classes generally make use of bipolar junction output transistors, which have fairly high power dissipation and relatively low efficiency. The relatively low efficiency generally means that relatively high power input is necessary from the power supply to enable the amplifiers to provide desired volume levels. In addition, the relatively high power dissipation generally means that relatively large and heavy heat sinks to dissipate the heat that is generated by the output transistors.

Recently, non-linear power amplifiers have been developed that have higher efficiency and lower power dissipation, thereby reducing the amount of power required from the power supply, as well as enabling the size and weight of the heat sinks that are required to dissipate the heat that is generated to be reduced. As a result, these so-called class-D power amplifiers are being used in low-power devices, such as battery-operated hand-held radio receivers and the like. In class-D amplifiers, the output transistors are typically field effect transistors ("FETs") that are operated as switches. When an FET transistor is off, the current through it is zero, and when the transistor is on, the voltage across it is relatively low. In both cases, the transistor's power dissipation is very low, thus requiring less power from the power supply, and allowing for smaller heat sinks.

One problem that can arise in connection with class-D power amplifiers is that it is desirable to operate them at a zero-DC offset voltage level, that is, if the input signal to the power amplifier has a zero-DC voltage level with respect to ground, the output of the amplifier will also have a zero-DC offset voltage level, and if the input signal has a non-zero-DC waveform, the output waveform will also have a non-zero-DC waveform, but it will have zero-DC time average voltage level. Circuits are known that can enable a class-D power amplifier to operate at a zero-DC offset level after the amplifier has been powered on. These circuits typically determine a weighted average of the voltage level of the output signal over a period of time. The weighting is typically such as to provide higher weights for voltage levels for the times close to the point in time at which the weighted average is determined, with the weights decreasing for times further in the past. In any case, since the circuits make use of weighted time averages, they will not be effective when the power amplifier is initially powered on. As a result, when the amplifier is initially powered on, it may have a non-zero-DC output signal, which can result in a pop or thump being generated by the speaker to which the amplifier is connected. The pop or thump can be quite annoying, and can, in addition, damage components, such as speakers, to which the amplifier is attached, particularly if the amplifier has a relatively high gain.

SUMMARY OF THE INVENTION

The invention provides a new and improved system and method for minimizing or eliminating a direct current ("DC") voltage offset in the outputs of audio power amplifiers.

In brief summary, the invention provides an amplifier system for receiving an input signal and generating therefrom an amplified output signal. The amplifier system is recited as comprising an input stage and an amplifier stage. The input stage is configured to receive the input signal and provide a level-shifted signal that has an average signal level that is shifted in regards a level shift value. The amplifier stage is configured to receive the level-shifted input signal from the input stage and generate therefrom the amplified output signal. The level shift value being selected to minimize a DC offset in the amplified output signal, at least when the amplifier system is initially powered on.

Since the amplified output signal has a minimal or zero DC offset when the amplifier system is initially powered on, the amplifier system avoids generation of undesirable noises when it is initially powered-on. Since noises generated when an amplifier system is initially powered on can be relatively high volume, and thus can damage to components, such as speakers, to which it is attached, minimizing or eliminating DC offset at power-on can also reduce or eliminate the likelihood of such damage.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 1, comprising FIGS. 1A and 1B, depicts a functional block diagram of an audio amplifier system constructed in accordance with the invention;

DETAILED DESCRIPTION OF AN ILLUSTRATIVE EMBODIMENT

Figure 1B:
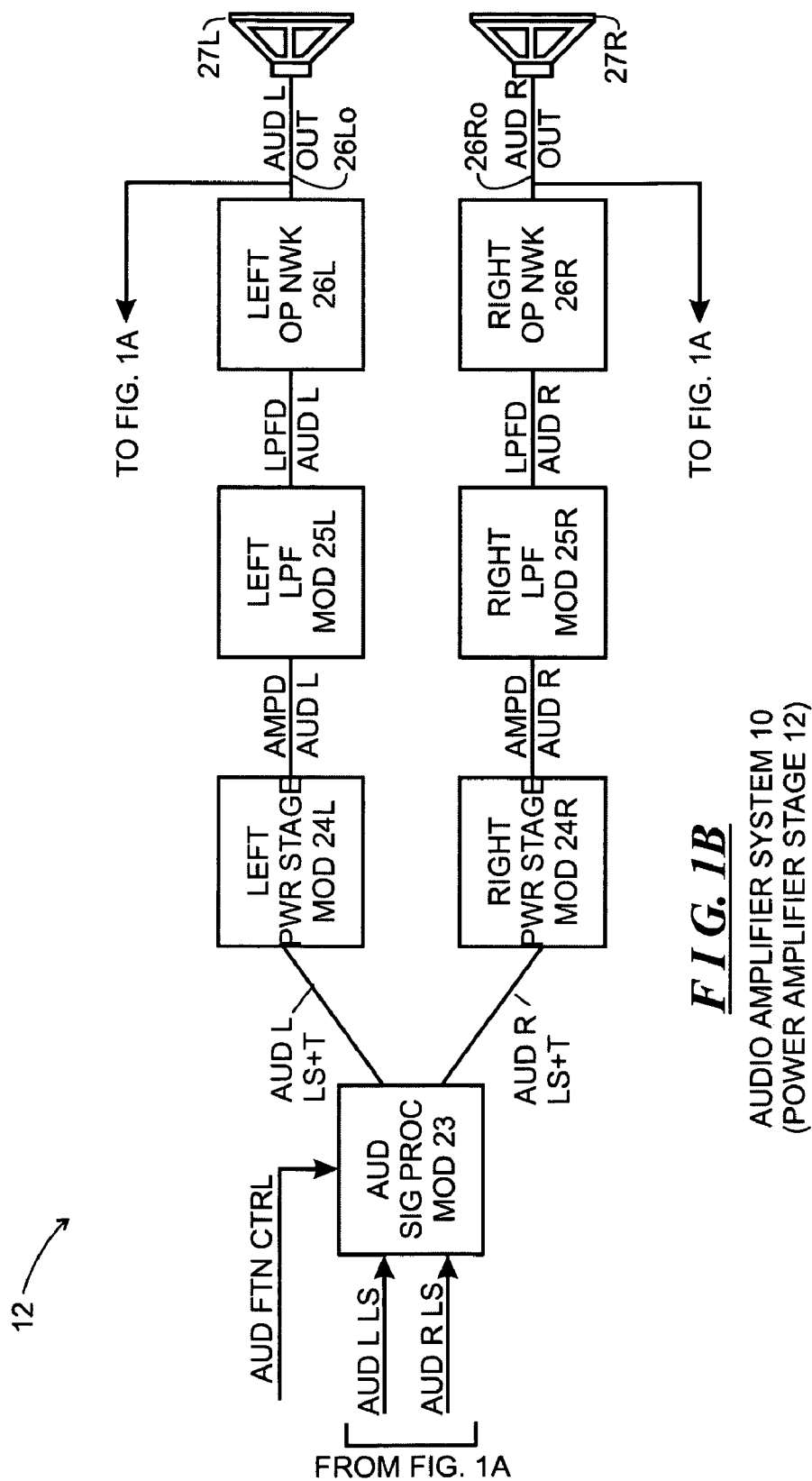

FIG. 1, comprising FIGS. 1A and 1B, depicts a functional block diagram of an audio amplifier system 10 constructed in accordance with the invention. The audio amplifier system 10 includes two general stages, including an input stage 11 (which is depicted in FIG. 1A) and a power amplifier stage 12 (which is depicted on FIG. 1B). Generally, the input stage 11 receives audio input signals, converts them as necessary from digital to analog form, attenuates the analog signals to facilitate gain control, and shifts the voltage level of the attenuated analog signals in a manner described below. In the audio amplifier system 10, the audio input signals are in digital form, and so the input stage 11 will include components to convert the digital audio input signals to analog form. The power amplifier stage 12 receives the level shifted analog signals, amplifies them and provides the amplified signals to output devices, such as speakers that can facilitate generation of sound waves for a listener. In the audio amplifier system 10 described herein, the power amplifier is generally in the form of a class-D power amplifier, an illustrative basic structure of which will be described below in connection with FIG. 2, although it will be appreciated that power amplifiers of other types and design classes may also find utility in the audio amplifier system 10.

With reference to FIG. 1A, the input stage 11 includes three sections, namely, an audio information processing section 13, a level correction generator section 14, and a summing section 15. The audio information processing section 13 receives the digital audio input signals for the left and right audio channels, converts the digital signals for the respective channels to analog form, attenuates the analog signals, and provides the attenuated analog signals to respective inputs of the summing section 15. The audio information processing section 13 includes a digital to analog converter module 16 and an attenuator module 17. The digital to analog converter module 16 receives respective DIG_AUD_IN_L and DIG_AUD_IN_R left and right channel digital audio input signals from a source (not shown), as well as a DAC_CLK digital to analog converter clock signal, and in response generates respective AN_AUD_IN_L and AN_AUD_IN_R left and right channel analog audio input signals. The operations by the digital to analog converter module 16 are generally conventional and will not be described here in detail.

The digital to analog converter module 16 provides the AN_AUD_IN_L and AN_AUD_IN_R left and right channel analog audio input signals to the attenuator module 17. The attenuator module 17 adjusts the relative level, or "gain," of the AN_AUD_IN_L and AN_AUD_IN_R left and right channel analog audio input signals in relation to a GAIN_C-TRL gain control signal that may be provided by other circuitry (not shown). The level of the gain provided by the attenuator module 17 will generally control the output volume of the audio output signals that are generated by the audio amplifier system 10. The attenuator module 17 provides respective AUD_L and AUD_R left and right channel analog audio signals to the summing section 15.

The level correction generator section 14 generates respective LS_CORR_L and LS_CORR_R left and right channel level shift correction right channel signals, which are also provided to respective inputs of the summing section 15. The level correction signals generated by the level correction generator section 14 generally provide that the voltage levels of the left and right channel audio output signals that are generated by the power amplifier stage 12 have a zero-DC voltage level when the audio amplifier system 10 is initially powered on. By providing that the left and right channel audio output signals generated by the audio amplifier system 10 have a zero-DC voltage level when the audio amplifier system 10 is initially powered on, the likelihood that annoying noises will be generated is reduced or eliminated, as will be the likelihood of damage to components, such as speakers, to which the audio amplifier system 10 is attached.

The level correction generator section 14 includes an microcontroller module 20, left and right DC offset determination modules 21L, 21R, and left and right power on level shift value stores 22L, 22R. The microcontroller module 20 generates the LS_CORR_L and LS_CORR_R left and right channel level shift correction signals in response to respective left and right power on level values stored in the power on level shift value stores 22L, 22R. Each left and right power on level shift value store 22L, 22R, stores, in digital form, a power on level shift value, represented by the PWR_ON_LS_CORR_L and PWR_ON_LS_CORR_R left and right channel power on level shift correction signals provided to the microcontroller module 20. The left and right power on level shift values, in turn, enable the microcontroller module 20 to generate the LS_CORR_L and LS_CORR_R left and right channel level shift correction signals so that, when those signals are summed with the respective AUD_L and AUD_R left and right channel analog audio signals provided by the audio information processing section 13, the left and right channel output signals generated by the audio amplifier system 10 will have a zero-DC offset voltage when the audio amplifier system 10 is initially powered on.

As will be described in more detail below, the left and right channel power on level shift values are generated during a calibration operation. During the calibration operation, each left and right DC offset determination module 21L, 21R receives the respective left and right channel audio output signals generated by the audio power amplifier stage 12 and generates respective DC_OFFSET_CORR_L and DC_OFFSET_CORR_R left and right channel DC OFFSET level shift correction signals. Each of the DC_OFFSET_CORR_L and DC_OFFSET_CORR_R signals indicates the extent to which the voltage amplitude of the respective audio output signal deviates from the zero-DC voltage level. During the calibration operation, the audio amplifier system 10 is muted, and the audio output signals effectively reflect the condition in which no audio input is provided. In that case, the DC offset determination modules 21L and 21R generate respective DC_OFFSET_CORR_L and DC_OFFSET_CORR_R left and right channel DC offset correction signals, which reflect the DC offsets of the respective audio output signals, and the microcontroller module 20 uses those signals to determine appropriate power on level shift values for storage in the respective stores 22L and 22R. After the power on level shift values have been determined and stored in the respective stores 22L and 22R, the microcontroller module 20 can use them to determine the appropriate level shift correction levels, represented by the LS_CORR_L and LS_CORR_R left and right channel level shift correction signals to be used at power on during normal operation of the audio amplifier system 10.

The output signals provided by the audio information processing section 13 and the level correction generator section 14 are provided to the summing section 15. The summing section 15 includes two summing nodes, namely, a left channel summing node 15L and a right channel summing node 15R. Each of the summing nodes 15L, 15R generates an analog output signal whose amplitude is essentially the sum of the amplitudes of the signals input thereto. In particular, the left channel summing node 15L receives the AUD_L left channel analog audio signal generated by the audio information processing section 13 and the LS_CORR_L left level shift correction signal and generates an AUD_L_LS level shifted left channel analog audio signal. Similarly, the right channel summing node 15R receives the AUD_R right channel analog audio signal generated by the audio information processing section 13 and the LS_CORR_R right level shift correction signal and generates an AUD_R_LS level shifted right channel analog audio signal. In each case, the waveform of the AUD_L_LS, AUD_R_LS level shifted analog audio signal generated by the respective summing node 15L, 15R generally corresponds to the waveform of the AUD_L, AUD_R analog audio signal input to the respective summing node 15L, 15R, with the respective DC voltage level shifted by an amount determined by the respective LS_CORR_L and LS_CORR_R left and right channel level shift correction signal.

The AUD_L_LS and AUD_R_LS left and right channel level shifted analog audio signals are provided to the power amplifier stage 12 (FIG. 1B), specifically to an audio signal processing module 23. In addition to the audio signal processing module, the power amplifier stage 12 also includes left and right power amplifier modules 24L and 24R and respective low-pass filter modules 25L and 25R and output networks 26L and 26R. The outputs of the output networks 26L and 26R are also connected to respective left and right channel output terminals 26Lo and 26Ro. The output terminals 26Lo and 26Ro may be connected to respective left and right channel audio output devices. In the embodiment described herein, the left and right channel audio output devices are represented by speakers 27L and 27R, which can provide stereophonic playback of the left and right channel audio signals.

In the illustrative audio amplifier system 10 described herein, the power amplifier stage 12 is generally in the form of a class-D audio amplifier. The structure and operation of a basic class-D audio will be provided below in connection with FIG. 2. Continuing with FIG. 1B, as noted above, the audio signal processor module 23 receives the AUD_L_LS and AUD_R_LS left and right channel level shifted analog audio signals from the summing section 15 (FIG. 1A) of the input stage 11. The audio signal processor module 23 performs several operations. In response to AUD_FTN_CTRL audio function control signals from other circuitry (not shown), the audio signal processor module 23 can perform several audio functions, such as muting, left/right channel balance control, and other audio functions as will be apparent to those skilled in the art.

In addition, the audio signal processor module 23 combines the respective AUD_L_LS and AUD_R_LS signals with a high-frequency triangular wave signal and provides the combined AUD_L_LS +T and AUD_R_LS+T left and right channel analog audio level shifted plus triangular wave signal to the respective left and right power amplifier modules 24L and 24 R. The left and right power amplifier modules 24L and 24R amplify the AUD_L_LS+T and AUD_R_LS+T left and right level shifted plus triangular wave signals, thereby to generate AMPD_AUD_L and AMPD_AUD_R amplified audio left and right signals, and provide the amplified signals to the low-pass filter modules 25L and 25R.

The AMPD_AUD_L and AMPD_AUD_R amplified audio left and right signals generated by the respective left and right power amplifier modules 24L and 24R are coupled to the respective left and right low-pass filters 25L and 25R, which filter out the high-frequency components of the amplified signals that are induced by the triangular waves. The LPFD_AUD_L and LPFD_AUD_R left and right channel filtered audio signals are coupled through the respective output networks 26L, 26R and provided to as AUD_L_OUT audio left out and AUD_R_OUT audio right out signals to the respective speakers 27L, 27R. The output networks 26L, 26R are provided to compensate for the inductance of the voice coils (not separately shown) of the speakers 27L, 27R, so that resistive loads are provided to the low-pass filter modules 25L, 25R.

Figure 2:
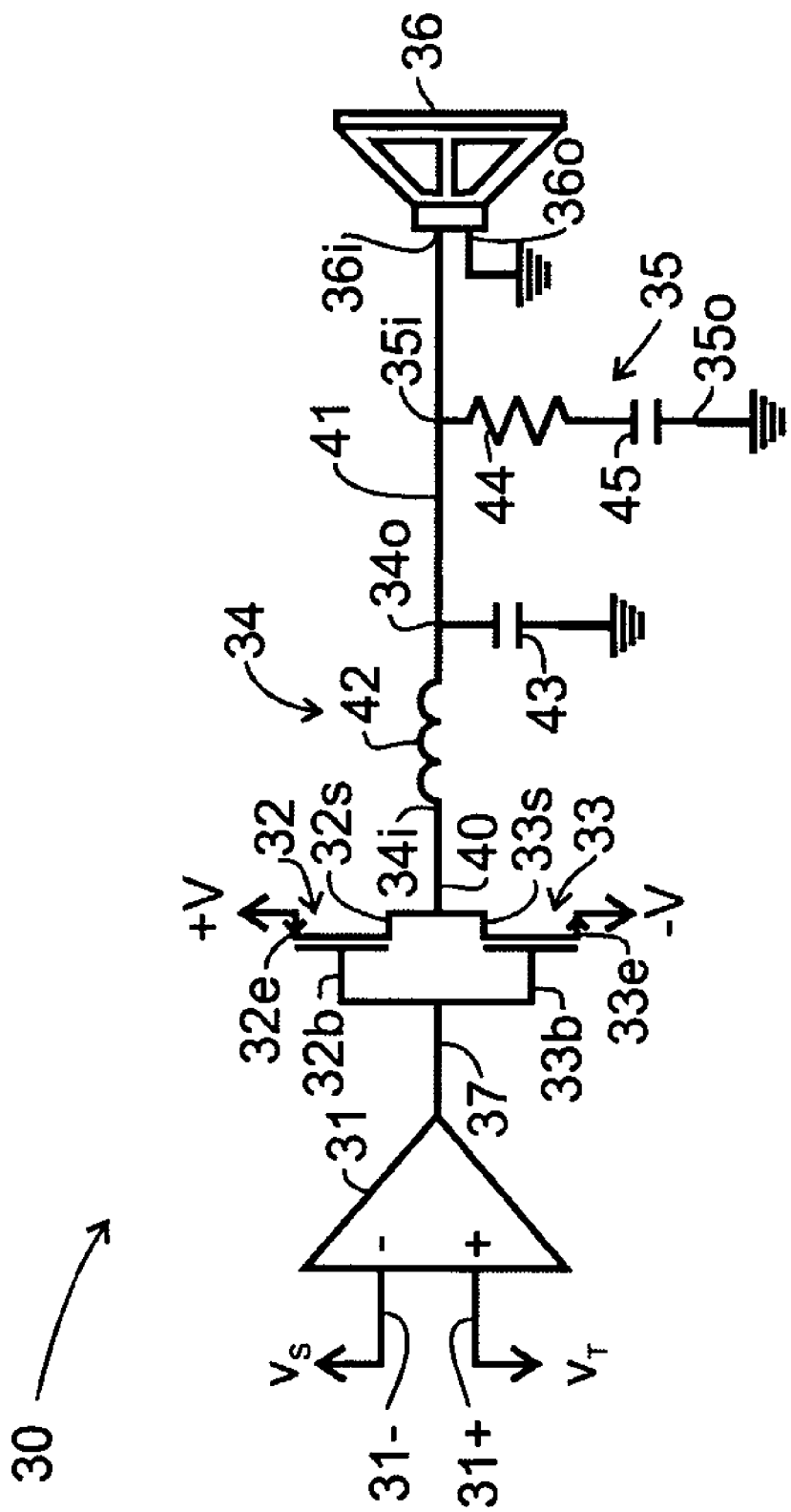
FIG. 2 depicts a schematic diagram of a basic class-D power amplifier that is useful in understanding the operation of the audio amplifier system depicted in FIG. 1.

Before going further, it would help to describe the structure and operation of a class-D audio amplifier useful in the audio amplifier system 10 depicted in FIG. 1B in more detail. A schematic diagram of a basic class-D audio amplifier 30 is depicted in FIG. 2. It will be appreciated that, since the audio amplifier system 10 provides stereophonic playback of left and right audio channels, a class-D audio amplifier will be provided in the audio amplifier system 10 for each of the audio channels. With reference to FIG. 2, basic class-D audio amplifier 30 includes a comparator 31, two metal-oxide-silicon field-effect transistors ("MOSFETs")32 and 33, a low-pass filter 34 and an output network 35. The output network 35 is connected to a speaker 36. It will be appreciated that, since the system 10 provides stereophonic output, the system 10 will include two amplifiers generally of the type depicted in FIG. 2. The comparator 31 is a component of the audio signal processor module 23 depicted in FIG. 1, and the MOSFETs 32 and 33 are components of the left and right power amplifier modules 24L, 24R. Similarly, the low-pass filter 34 is a component of the left and right low-pass filter modules 25L, 25R and the output network 35 is a component of the left and right output networks 26L, 26R. The speaker 36 depicted in FIG. 2 corresponds to the speaker 27L, 27R for the respective audio channel depicted in FIG. 1B.

In the basic class-D audio amplifier 30 depicted in FIG. 2, the two MOSFETs 32 and 33 are connected in series between positive and negative terminals of a bipolar power supply (not shown). The bipolar power supply provides a positive voltage +V to the emitter terminal 32e of MOSFET 32 and a corresponding negative voltage −V to the emitter terminal 33e of MOSFET 33, with the positive voltage +V and negative voltage −V both being with respect to a ground reference voltage level. The source terminals 32s and 33s of the MOSFETs 32 and 33 are connected together to form a node 40. The base terminals 32b and 33b of the MOSFETs 32 and 33 are both connected to a node 37, to which the output terminal 31o of the comparator 31 is also connected.

The low-pass filter 34 has an input terminal 34i that is connected to the node 40 and an output terminal 34o that is connected to a node 41. One input terminal 35i of output network 35 and one input terminal 36i of the speaker 36 are also connected to node 41, and the other terminals 35o and 36o of both output network 35 and speaker 36 are both connected to ground. The low-pass filter 34 includes an inductor 42 and a capacitor 43. The inductor 42 is connected between input terminal 34i and output terminal 34o and the capacitor 43 is connected between the output terminal 34o and ground. The inductance and capacitance of the inductor 42 and capacitor 43 are selected to have a cut-off frequency as will be described below.

The output network 35 includes a resistor 44 and a capacitor 45 connected between the node 41 and ground. The values of the resistor 44 and capacitor 45 are chosen so as to provide compensation for the inductive impedance of the voice coil (not separately shown) of the speaker 36, so that a resistive load is presented at the output terminal 34o of the low-pass filter 34 at high frequencies.

The comparator 31 is the signal input device of the basic class-D audio amplifier 30 depicted in FIG. 2. The comparator 31 has two terminals, namely, an inverting terminal 31− that receives the audio input signal, and a non-inverting terminal 31+ that receives a signal having a triangular wave form. The audio input signal is the signal that is to be amplified by the amplifier 30. The triangular wave signal is generated internally by the audio signal processor module 23 depicted in FIG. 1, and is separately applied to each of the AUD_L_LS and AUD_R_LS level shifted audio signals that the audio signal processor module 23 receives from the input stage 11. The triangular signal preferably has a frequency that is much higher than the peak frequency of the audio input signal that is to be amplified, and also has a peak-to-peak voltage that is higher than the maximum peak-to-peak voltage of the audio input signal provided at the inverting terminal 31−.

The output signal provided by the comparator 31 at the node 40 is the sum the two input signals at its input terminals. As the comparator's output signal at node 37 goes positive with respect to ground, which will be the case as the sum of the audio input signal and the triangular wave goes above zero, the MOSFET 32 will be on and MOSFET 33 will be off, with the extent to which MOSFET 32 conducts being related to the extent to which the sum is above zero. As the sum increases above ground, the voltage applied to node 40 will increase. If voltage at node 37 is sufficiently high to turn the MOSFET 32 fully on, the voltage at node 40 will increase to a maximum voltage of +V with respect to ground, less a small voltage drop across the MOSFET 32.

On the other hand, as the comparator's output signal at node 37 goes positive with respect to ground, which will be the case as the sum of the audio input signal and the triangular wave goes below zero, the MOSFET 32 will be off and MOSFET 33 will be on, with the extent to which MOSFET 32 conducts being related to the extent to which the sum is below zero. As the sum decreases below ground, the voltage applied to node 40 will decrease. If voltage at node 37 is sufficiently low to turn the MOSFET 33 fully on, the voltage at node 40 will decrease to a minimum voltage of −V with respect to ground, plus a small voltage corresponding to the drop across the MOSFET 33.

The waveform provided by the MOSFETs 32 and 33 to node 40 is generally pulse-width modulated, with the pulse width generally being related to the period of the triangular wave that is applied to the non-inverting terminal 31+ of the comparator 31. The input terminal 34i of the low-pass filter 34 receives the signal at node 40 and passes the low-frequency component of the signal at the node 40 to its output terminal 34i. The signal passed by the low-pass filter 34 to node 41 is the amplified audio input signal that is applied to the inverting terminal 31− of the comparator 31. The cut-off frequency of the low-pass filter 34 is selected so as to pass the amplified audio input signal, and reject higher-frequency harmonics of the waveform at node 40, the latter of which is induced in the waveform at node 40 by the triangular wave that is applied to the non-inverting terminal 31+ of the comparator 31.

The output signal provided by the low-pass filter 34 at node 41 drives the speaker 36.

It will be appreciated that numerous changes and modifications may be made to the basic class-D audio amplifier 30 described above, in connection with FIG. 2. For example, a class-D amplifier can be constructed to provide a signal to speaker 36 in a "push-pull" manner. Such an amplifier would basically correspond to two of the basic amplifiers described above in connection with FIG. 2, with the audio input signal and the triangular signal input to the two basic amplifiers being complementary.

Returning to FIGS. 1A and 1B, as noted above, and, in particular, the discussion regarding the LS_CORR_L and LS_CORR_R left and right channel level shift correction signals generated by the level correction generator section 14, the DC offset determination modules 21L, 21R in the level correction generator section 14 (FIG. 1A) are also connected to terminals 26Lo and 26Lr. Terminals 26Lo and 26Lr correspond to node 41 in FIG. 2. Accordingly, the DC offset determination modules 21L, 21R also receive the respective AUD_L_OUT and AUD_R_OUT left and right channel audio output signals from the output networks 26L, 26R. In response to the AUD_L_OUT and AUD_R_OUT signals, the DC offset determination modules 21L, 21R generate respective DC_OFFSET_CORR_L, DC_OFFSET_CORR_R left and right channel DC offset correction signals as described above. The amplitude of each of the DC_OFFSET_CORR_L and DC_OFFSET_CORR_R left and right channel incremental level-shift correction signals is a function of the extent to which the respective AUD_L_OUT and AUD_R_OUT left and right channel audio output signal deviates from a zero-DC voltage level.

Figure 3:
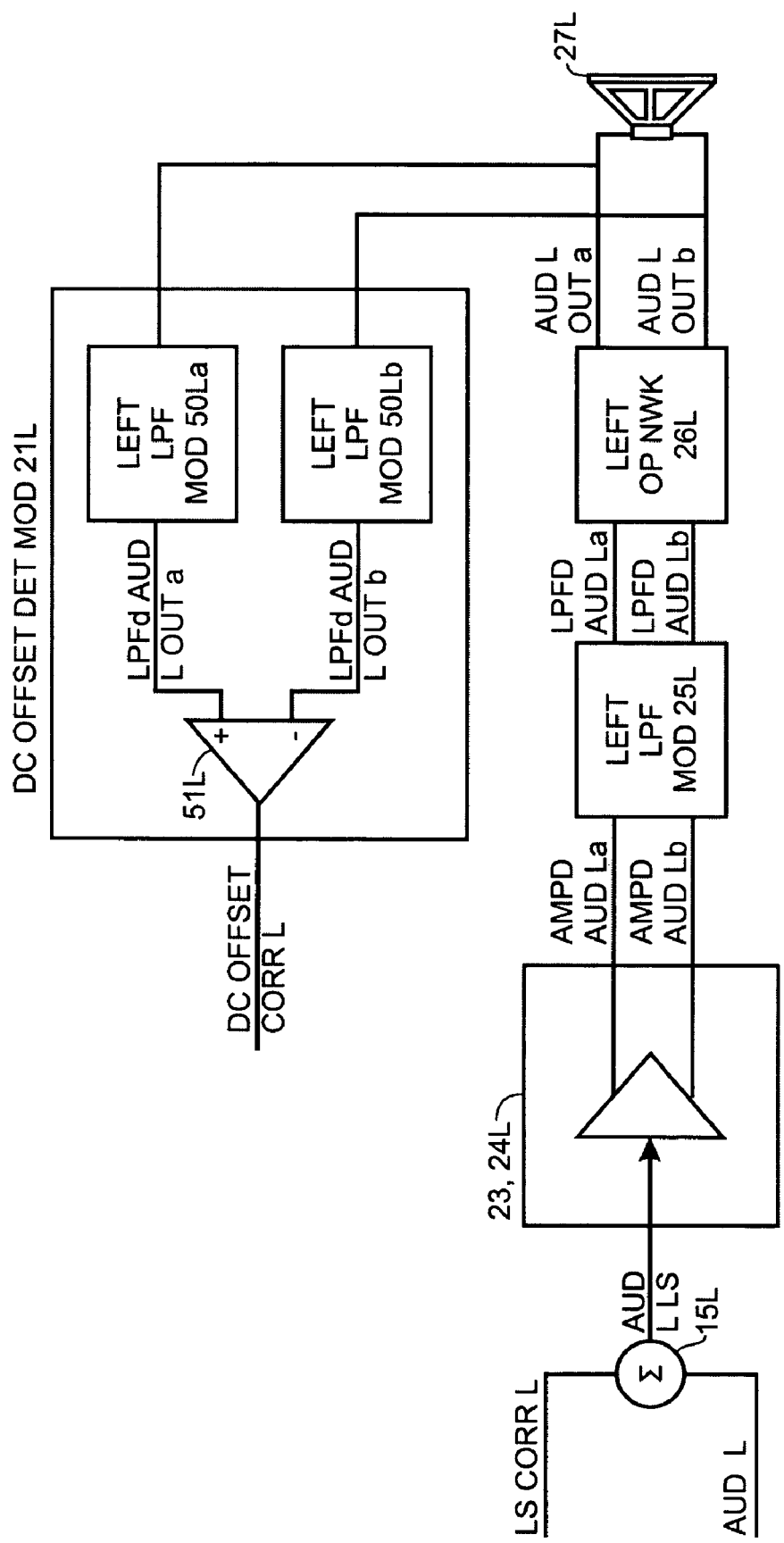
FIG. 3 depicts a detailed functional block diagram of the audio amplifier system depicted in FIGS. 1A and 1B useful in understanding the invention.
Figure 4A:
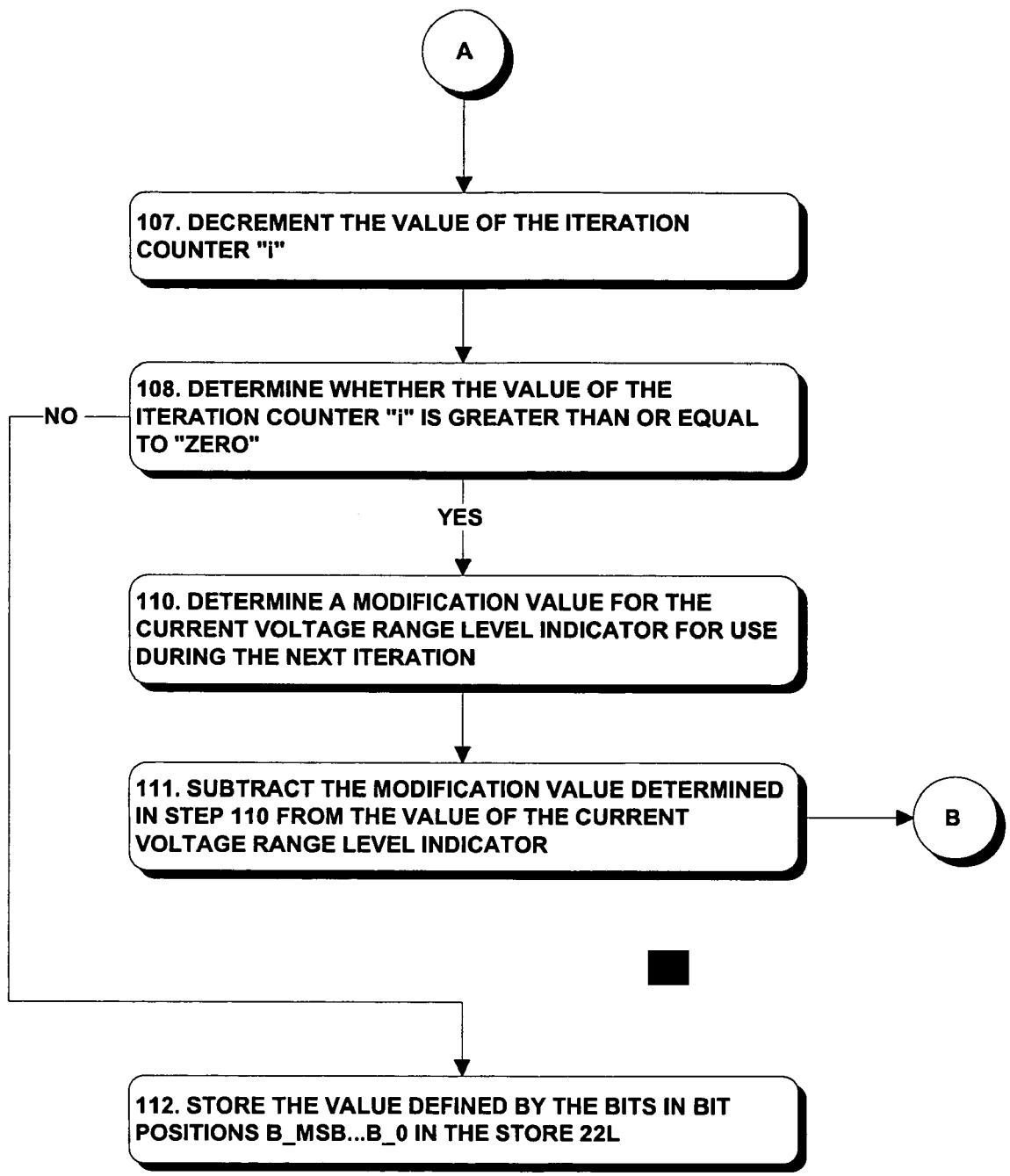
FIG. 4 depicts a flow chart describing operations of the audio amplifier system in connection with the invention.

Operations performed by the components of the audio amplifier system 10 associated with the left and right channels in connection with providing that the audio output signals have zero-DC voltage output levels are similar, and so only the operations performed by the components associated with the left channel will be described in detail in connection with FIGS. 1A and 1B, and further in connection with FIG. 3 and FIG. 4. FIG. 3 depicts a detail of the portion of the audio amplifier system 10 associated with the left audio channel, in particular showing the summing node 15L, audio signal processing module 23, and the power stage module 24L, the low-pass filter module 25L, the output network 26L, the speaker 27L and a detail of the DC offset determination module 21L, all of which are associated with the left audio channel. (In FIG. 3, the audio signal processing module 23 and the power stage module 24L are depicted in a common block labeled by reference numeral "23, 24L.") As shown in FIG. 3, the power stage module 24L operates in a "push-pull" manner to generate two output signals, identified as AMPD_AUD_L_a and AMPD_AUD_L_b left channel amplified audio signals "a" and "b." The low-pass filter module 25L and output network 26L process each of the "a" and "b" left channel amplified audio signals as described above, in an independent manner to generate AUD_L_OUT_a and AUD_L_OUT_b "a" and "b" left channel audio output signals, which are connected to respective output terminals to drive the speaker 27L.

The AUD_L_OUT_a and AUD_L_OUT_b "a" and "b" left channel audio output signals are also provided to the DC offset determination module 21L, which uses them to generate the DC_OFFSET_CORR_L left channel DC offset correction signal. The DC offset determination module 21L includes "a" and "b" low-pass filter modules 50La and 50Lb and a comparator 51L. The low-pass filter modules 50La and 50Lb operate to filter the AUD_L_OUT_a and AUD_L_OUT_b "a" and "b" left channel audio output signals to generate respective LPFd_AUD_L_OUT_a and LPFd_AUD_L_OUT_b "a" and "b" left channel low-pass filtered audio output signals, which are provided to the non-inverting and inverting inputs, respectively of the comparator 51L. As described above, the low-pass filter module 25L is provided to filter out the high-frequency components of the amplified signals that are induced by the triangular waves. The low-pass filter 25L will suffice to filter out high-frequency components at least sufficiently so that they would not be audible in the sound that is generated by the speaker 27L. Since the speaker 27L itself effectively provides some filtering, the low-pass filter 25L need not completely filter out all of the high-frequency components, and the AUD_L_OUT_a and AUD_L_OUT_b signals may still contain some residual high-frequency components. The low-pass filter modules 50La and 50Lb are provided to further low-pass filter the AUD_L_OUT_a and AUD_L_OUT_b "a" and "b" left channel audio output signals before coupling the filtered LPFd_AUD_L_a and LPFd_AUD_L_b signals to the comparator 51L.

The comparator 51L receives the LPFd_AUD_L_OUT_a and LPFd_AUD_L_OUT_b "a" and "b" left channel low-pass filtered audio output signals, and generates an output signal that indicates whether the voltage level of the LPFd_AUD_L_OUT_a "a" left channel low-pass filtered audio output signal is higher or lower than the voltage level of the LPFd_AUD_L_OUT_b "b" left channel low-pass filtered audio output signal. As noted above, the microcontroller module 20 (FIG. 1A) uses the DC_OFFSET_CORR_L left channel DC offset signal during the calibration operation to determine a power-on level shift correction value for storage in the power on level shift value store 22L. The microcontroller module 20 will generate the power-on level shift correction value to tend to minimize the difference between the voltage levels of the AUD_L_OUT_a and AUD_L_OUT_b "a" and "b" left channel audio output signals when the DIG_AUD_IN_L left channel digital audio input signal has a zero or muted input level. Operations performed by the microcontroller module 20 during the calibration operation for the left channel will be described in connection with FIGS. 1A and 3 and further in connection with the flow chart depicted in FIG. 4. Generally, during the calibration operation, the microcontroller module 20 uses a successive approximation operation to generate the power-on level shift correction value for storage in the left channel power on level shift value store 22L. The microcontroller module 20 can generate the LS_CORR_L left channel level shift correction signal within a predetermined voltage range; for illustrative purposes, the voltage range will be referred to as between a low of "0" vDC (zero volts DC) and a high of "V" vDC (positive "V" volts DC), although it will be appreciated that the low end of the range differ from zero volts DC. As the voltage level of the LS_CORR_L signal changes from 0 vDC toward V vDC, the voltage level of the AUD_L_OUT_b signal decreases and the voltage level of the AUD_L_OUT_a signal increases. In the following it will be assumed that the voltage range of the LS_CORR_L signal is selected so that, (i) when the LS_CORR_L signal is at 0 vDC, the voltage level of the AUD_L_OUT_b "b" left channel audio output signal is higher than the voltage level of the AUD_L_OUT_a "a" left channel audio output signal, and (ii) when the LS_CORR_L signal is at V vDC, (A) preferably the voltage level of the AUD_L_OUT_a signal will be at least the same as, or higher than, the voltage level of the AUD_L_OUT_b signal, but (B) if the voltage level of the AUD_L_OUT_b signal is still higher than the voltage level of the AUD_L_OUT_a signal, the difference between voltage levels of the AUD_L_OUT_b and AUD_L_OUT_a signals will at least be reduced.

The microcontroller module 20 initially generates the LS_CORR_L left channel level shift correction signal at 0 vDC (zero volts DC). In that case, the voltage level of the AUD_L_OUT_b "b" left channel audio output signal will generally be higher than the voltage level of the AUD_L_OUT_a "a" left channel audio output signal, ignoring residual variations in the voltage levels of the signals that have not been filtered out by the left low-pass filter module 25L, but which would be filtered out by the low-pass filter modules 50La and 50Lb. In the following description, such residual variations will be ignored, and reference will be made to the relative voltage levels of the AUD_L_OUT_b and AUD_L_OUT_a signals instead of the LPFd_AUD_L_b and LPFd_AUD_L_OUT_a signals.

During the successive approximation operation, the microcontroller module 20 performs a series of iterations during which it conditions successive bits of the left channel digital power-on level shift correction value. The number of iterations corresponds to the number of bits comprising the power-on level shift correction value. During each iteration, the microcontroller module 20 modifies the voltage level of the LS_CORR_L left channel level shift correction signal, determines the effect that the modification has on the output of the comparator 51L and conditions a bit of the left channel power on level shift correction value based on the determined effect. During the successive iterations, the microcontroller module 20 modifies the voltage level of the LS_CORR_L signal within successively finer portions of the range, and conditions the successive bits from the most significant bit position to the least significant bit position of the left channel power on level shift correction value. Thus, if the left channel power on level shift correction value comprises bits in bit positions $B_{msb} \ldots B_0$, where "$B_{msb}$" represents the most significant bit position, and "$B_0$" represents the least significant bit position, the microcontroller module 20 will determine a value for the bit in bit position $B_{msb}$ during the first iteration, the bit in bit position $B_{msb-1}$ during the second iteration, and so forth. Generally, during the "i-th" iteration, the microcontroller module will determine a value for the bit in the bit position $B_{msb-i+1}$. Initially, the bits in all of the bit positions are clear, representing the value "zero." After the microcontroller module 20 has performed "msb+1" iterations, it will have determined values for all of the bits comprising the left channel power on level shift correction value, and it can store the value in the power on level shift value store 22L for later use when the audio amplifier system 10 is powered-on.

During the first iteration, the amplifier control module 20 will set the voltage level of the LS_CORR_L left channel level shift correction signal to the mid-point of the signal's voltage range. For the illustrative voltage range described herein, the microcontroller module 20 will provide the LS_CORR_L signal with a voltage level of ½V vDC. After a time period, which is selected to be sufficient to allow the DC_OFFSET_CORR_L left channel DC offset correction signal generated by the comparator 51L to settle, the microcontroller module 20 will determine the condition of the DC_OFFSET_CORR_L signal. If (a) the microcontroller module 20 determines that the DC_OFFSET_CORR_L signal is still negated, the voltage level of the AUD_L_OUT_b signal is still higher than the voltage level of the AUD_L_OUT_a signal; but (b) if the microcontroller module 20 determines that the DC_OFFSET_CORR_L signal has shifted to the asserted, or positive, condition, the voltage level of the AUD_L_OUT_b signal is lower than the voltage level of the AUD_L_OUT_a signal.

After the microcontroller module 20 makes the determination, it will condition the bit in the most significant bit position $B_{msb}$ to a predetermined value. For example, if the microcontroller module 20 determines that the DC OFFSET_CORR_L signal is still negated (case (a)), the increase in the voltage level of the LS_CORR_L from 0 vDC to ½V vDC provided an insufficient correction; in that case, the microcontroller module 20 will set the bit to a value "1." On the other hand, if the microcontroller module 20 determines that the DC_OFFSET_CORR_L signal has shifted to the asserted condition (case (b)), the increase in the voltage level of the LS_CORR_L from 0 vDC to ½V vDC provided an over-correction; in that case, the microcontroller module 20 will allow the bit to remain clear, representing the value "0." After the microcontroller module 20 has made the determination and either set the bit in the bit position $B_{msb}$, or allowed the bit to remain in the clear condition, it will determine whether a second iteration is to be performed. If the left channel power-on level shift value has a bit in a bit position $B_{msb-1}$, a second iteration is to be performed. In that case, the microcontroller module 20 adjusts the value of the LS_CORR_L left channel level shift correction signal and proceeds to the second iteration.

For the second and subsequent iterations, the condition of the bit in bit position $B_{msb}$ identifies a portion of the voltage range for the LS_CORR_L left channel level shift correction signal in which the microcontroller module 20 will be subsequently operating during the calibration operation. In particular, if the bit in the most-significant bit position $B_{msb}$ is set (reference case (a) above), the microcontroller module 20 will be operating in the upper half of the voltage range, that is between ½V vDC and V vDC. On the other hand, if the bit in bit position $B_{msb}$ is clear (reference case (b) above), the microcontroller module 20 will be operating in the lower half of the voltage range, that is, between 0 vDC and ½V vDC. That is, if, during the first iteration, the microcontroller module 20 determined that the DC_OFFSET_CORR_L signal is negated (reference case (a) above), for the second iteration it will increase the voltage level of the LS_CORR_L signal from ½V vDC to ¾ V vDC. After a time period, which is selected to be sufficient to allow the DC_OFFSET_CORR_L left channel DC offset correction signal generated by the comparator 51L to settle, the microcontroller module 20 will determine the condition of the DC_OFFSET_CORR_L signal. If (a)(a) the microcontroller module 20 determines that the DC_OFFSET_CORR_L signal is still negated, the voltage level of the AUD_L_OUT_b signal is still higher than the voltage level of the AUD_L_OUT_a signal; but (a)(b) if the microcontroller module 20 determines that the DC_OFFSET_CORR_L signal has shifted to the asserted, or positive, condition, the voltage level of the AUD_L_OUT_b signal is lower than the voltage level of the AUD_L_OUT_a signal.

It will be appreciated that, for case (a)(a), ¾ V vDC was still insufficient, whereas for case (a)(b), the change of the voltage level of the LS_CORR_L signal from ½V vDC to ¾ V vDC provided an over-correction.

On the other hand, assuming that, during the first iteration, the microcontroller module 20 determined that the DC_OFFSET_CORR_L signal was asserted (reference case (b) above), it will decrease the voltage level of the LS_CORR_L signal, in this iteration to ¼ V vDC. After a time period, which is selected to be sufficient to allow the DC_OFFSET_CORR_L left channel DC offset correction signal generated by the comparator 51L to settle, the microcontroller module 20 will determine the condition of the DC_OFFSET_CORR_L signal. If (b)(a) the microcontroller module 20 determines that the DC_OFFSET_CORR_L signal is negated, the voltage level of the AUD_L_OUT_b signal is higher than the voltage level of the AUD_L_OUT_a signal; but (b)(b) if the microcontroller module 20 determines that the DC_OFFSET_CORR_L signal has shifted to the asserted, or positive, condition, the voltage level of the AUD_L_OUT_b signal is lower than the voltage level of the AUD_L_OUT_a signal.

It will be appreciated that, for case (b)(a), the shift of the voltage level of the LS_CORR_L signal from ½V vDC provided an over-correction, whereas, for case (b)(b), ¼ V vDC still provides an over-correction.

For cases (a)(a) through (b)(b), the microcontroller module 20 will, (1) in case (a)(a), set the bit in bit position $B_{msb-1}$, thereby providing that the bits in bit positions $B_{msb}B_{msb-1}$ have a bit pattern "11,"

(2) in case (a)(b), maintain the bit in bit position $B_{msb-1}$ in the clear condition, thereby providing that the bits in bit positions $B_{msb}B_{msb-1}$ have a bit pattern "10,"

(3) in case (b)(a), set the bit in bit position $B_{msb-1}$, thereby providing that the bits in bit positions $B_{msb}B_{msb-1}$ have a bit pattern "01," and (4) in case (b)(b), maintain the bit in bit position $B_{msb-1}$ in the clear condition, thereby providing that the bits in bit positions $B_{msb}B_{msb-1}$ have a bit pattern "00."

After the microcontroller module 20 has made the determination and either set the bit in the bit position $B_{msb-1}$, or allowed the bit to remain in the clear condition, it will have completed the second iteration.

After the microcontroller module 20 has completed the second iteration, it proceeds to the third iteration to condition the bit in bit position $B_{msb-2}$. For the third and subsequent iterations, the bit pattern in bit positions $B_{msb}B_{msb-1}$ identifies a portion of the voltage range for the LS_CORR_L left channel level shift correction signal in which the microcontroller module 20 will be subsequently operating during the calibration operation. In particular, if the bits in bit positions $B_{msb}B_{msb-1}$ have the bit pattern "11" (reference case (a)(a) and item (1) above), the microcontroller module 20 will be operating in the upper half of the upper half (that is, the upper quarter) of the voltage range, that is between ¾ V vDC and V vDC. On the other hand, if the bits in bit positions $B_{msb}B_{msb-1}$ have the bit pattern "10" (reference case (a)(b) and item (2) above), the microcontroller module 20 will be operating in the lower half of the upper half of the voltage range, that is, between ½V vDC and ¾ V vDC. Similarly, if the bits in bit positions $B_{msb}B_{msb-1}$ have the bit pattern "01" (reference case (b)(a) and item (3) above), the microcontroller module 20 will be operating in the upper half of the lower half of the voltage range, that is between ¼ V vDC and ½V vDC. Finally, if the bits in bit positions $B_{msb}B_{msb-1}$ have the bit pattern "00" (reference case (b)(b) and item (4) above), the microcontroller module 20 will be operating in the lower half of the lower half of the voltage range, that is, between 0 vDC and ¼ V vDC. Thus, for bit pattern "11," the microcontroller module 20 will increase the voltage level of the LS_CORR_L signal from ¾ V vDC to ⅞ V vDC, "10," the microcontroller module 20 will decrease the voltage level of the LS_CORR_L signal from ¾ V vDC to ⅝ V vDC, "01," the microcontroller module 20 will increase the voltage level of the LS_CORR_L signal from ¼ V vDC to ⅜ V vDC, and "00," the microcontroller module 20 will decrease the voltage level of the LS_CORR_L signal from ¼ V vDC to ⅛ V vDC.

After the microcontroller module 20 has condition the voltage level of the LS_CORR_L signal, it will repeat the operations described above to determine whether the DC_OFFSET_CORR_L signal from the comparator 51L is asserted or negated, and condition the bit in bit position $B_{msb-2}$ accordingly.

The microcontroller module 20 repeats the operations described above for each bit in successive bit positions $B_{msb-3} \ldots B_0$ in subsequent iterations. It will be appreciated that the microcontroller module 20 will perform "msb+1" iterations, and, as the microcontroller module 20 proceeds through the series of iterations, it will modify the voltage level of the LS_CORR_L left channel level shift correction signal through finer and finer regions of the voltage range 0-V vDC. Every successive modification will bring the voltage level of the LS_CORR_L signal closer to the level that would bring the voltage level of the AUD_L_OUT_b "b" left channel audio output signal closer to the voltage level of the AUD_L_OUT_a "a" left channel audio output signal. The final bit pattern, which represents a binary-encoded value between zero and $2^{msb+1}-1$, will be stored in the left channel power-on level shift value store 22L, and will be subsequently used by the microcontroller module 20 to set the voltage level of the LS_CORR_L signal when the audio amplifier system 10 is powered-on. It will be appreciated from the above that, if the binary-encoded value that is stored in the store 22L is "n," the microcontroller module 20 will establish the voltage level of the LS_CORR_L signal as $$\frac{n+\delta}{2^{msb+1}} V$$

where $0 \leq \delta < 1$. The value "$\delta$" may be provided to allow the microcontroller module 20 to provide actual voltage levels that differ slightly from $$\frac{n}{2^{msb+1}} V,$$

but is not required for an actual implementation.

With this background, and with reference to FIG. 4, the operations performed by the microcontroller module 20 during the calibration operation in connection with determining the power-on level-shift value to be stored in store 22L are as follows:

(i) initialize the power-on level shift value by initializing the bits in bit positions $B_{msb} \ldots B_0$ of the value to zero (step 100);

(ii) initialize the value of an iteration counter "i" to "msb" (step 101);

(iii) initialize the value of a current voltage range level indicator at ½ (step 102);

(iv) set the voltage level of the LS_CORR_L left channel level shift correction signal at a point in its voltage range indicated by the value of the current voltage range level indicator (step 103);

(v) wait a selected time period, to allow the DC_OFFSET_CORR_L left channel DC offset correction signal to stabilize (step 104); and (vi) determine whether the DC_OFFSET_CORR_L signal is negated (step 105).

If the microcontroller module 20 makes a positive determination in step 105 (that is, if it determines that the DC_OFFSET_CORR_L signal is negated), it performs the following operation:

(vii) set the bit in bit position $B_i$ to "one" (step 106).

The microcontroller module 20 performs the following operations after step 106, or after step 104 if it makes a negative determination in that step 105 (that is, if it determines that the DC_OFFSET_CORR_L signal is asserted):

(viii) decrement the value of the iteration counter "i" (step 107);

(ix) determine whether the value of the iteration counter "i" is greater than or equal to "zero" (step 108).

If the microcontroller module 20 makes a positive determination in step 108, it has not determined the values for the bits in all of the bit positions $B_{msb} \ldots B_0$ in the power-on level-shift value to be stored in store 22L. In that case, the microcontroller module will perform the following operations:

(x) determine a modification value for the current voltage range level indicator corresponding to $$(-1)^{b_{i+1}} \left(\frac{1}{2}\right)^{msb-i+1},$$

where "$b_{i+1}$" represents the value of the bit in the bit position $B_{i+1}$, for use during the next iteration (step 110);

(xi) subtract the modification value determined in step 110 from the value of the current voltage range level indicator (step 111).

Following step 111, the microcontroller module 20 returns to step 103 (item (iv) above) for the next iteration. Returning to step 108, if the microcontroller module 20 makes a negative determination in that step, it will have performed "msb+1" iterations, and therefore will have determined the values for the bits in all of the bit positions $B_{msb} \ldots B_0$ in the power-on level-shift value to be stored in store 22L. In that case, the microcontroller module 20 will perform the following operation:

(xii) store the value defined by the bits in bit positions $B_{msb} \ldots B_0$ in the store 22L (step 112).

The microcontroller module 20 will also perform similar operations (reference items (i) through (xii)) for the right channel. After it has completed operations for both channels it will have completed the calibration operation.

Generally, regarding the operations described in connection with items (i) through (xii) above, and continuing the reference to the left audio channel, in step 100 the microcontroller module 20 initializes the bits comprising the power-on level shift value, in step 101 it initializes an iteration counter "i," and in step 102 it initializes the value of a current voltage range level indicator. In step 100, the microcontroller module 20 clears all of the bits of the power-on level shift value, thereby providing them with the value "0." The microcontroller module 20 uses the iteration counter "i" for two purposes. First, the microcontroller module 20 uses the iteration counter to identify the bit position $B_i$ of the bit whose value is being determined during the iteration. Second, the microcontroller module 20 uses the iteration counter to determine when it has determined values for all of the bits comprising the power-on level shift value. When the microcontroller module 20 initializes the iteration counter "i," it initializes it to the value "msb," thereby to initially point to bit position $B_{msb}$. The microcontroller module 20 uses the current voltage range level indicator to indicate the point in the DC_OFFSET_CORR_L left channel DC offset correction signal's voltage range at which the voltage level is to be set for the iteration. As described above, initially the voltage level of the DC_OFFSET_CORR_L signal is set to ½V vDC, the middle of its voltage range, and so the microcontroller module 20 will initialize the value of the current voltage range level indicator to "½."

Following the initialization steps 100 through 102, the microcontroller module 20 sets the voltage level of the LS_CORR_L left channel level shift correction signal to the level indicated by the current voltage range level indicator, that is, to ½V vDC in the first iteration (step 103), waits a selected time to allow the DC_OFFSET_CORR_L left channel DC offset correction signal generated by the comparator 51L (FIG. 3) to settle (step 104), and determines whether the signal is negated (step 105). As noted above, in this description it is assumed that, if the voltage level of the AUD_L_OUT_b "b" left channel audio output signal is higher than the voltage level of the AUD_L_OUT_a signal, the DC_OFFSET_CORR_L signal generated by the comparator 51L is negated. If the microcontroller module 20 makes a positive determination in step 105, that is, if it determines that the DC_OFFSET_CORR_L signal generated by comparator 51L is negated, it performs step 106 to set the bit in bit position $B_i$, that is, the bit position pointed to by the iteration counter "i." As noted above, the iteration counter "i" initially points to bit position $B_{msb}$, and so, if, during the first iteration, the microcontroller module 20 determines in step 105 that the DC_OFFSET_CORR_L signal is negated, it will set the bit in bit position $B_{msb}$ in step 106. Following step 106, the microcontroller module 20 will sequence to step 107. On the other hand, if the microcontroller module 20 determines in step 105 that the DC_OFFSET_CORR_L signal is asserted, it will skip step 106, and instead will sequence directly from step 105 to step 107, which will leave the bit in bit position $B_{msb}$ clear.

Following step 105, or step 106 if a positive determination is made in step 105, the microcontroller module 20 performs several steps to determine whether another iteration is to be performed, and, if so, adjust the value of the current voltage range level indicator to indicate the voltage level of the LS_CORR_L left channel level shift correction signal that is to be used during the next iteration. To determine whether another iteration is to be performed, the microcontroller module 20 will decrement the value of the iteration counter "i" by "one" (step 107) and determine whether the value of "i," as decremented in step 107, is positive or zero (step 108). In the first iteration, the value of "i" as decremented in step 107 will correspond to "msb−1." Assuming that "msb" is not equal to "zero," the value "msb−1" will be greater than or equal to zero. In that case, the microcontroller module 20 will make a positive determination in step 108 and perform another iteration during which it will determine the value for the bit in the bit position $B_{msb-1}$. As will be described below, if the microcontroller module 20 makes a negative determination in step 108, the decremented value of the iteration counter "i" is less than zero, and so it will have determined values for bits in all of the bit positions $B_{msb} \ldots B_0$ of the power-on level shift value.

If the microcontroller module 20 makes a positive determination in step 108, it sequences to steps 110 and 111 to adjust the value of the current voltage range level indicator to indicate the voltage level of the LS_CORR_L left channel level shift correction signal that will be used during the next iteration. In step 110, the microcontroller module 20, determines a modification value that indicates the amount by which the voltage level is to be adjusted. In step 111, the microcontroller module 20 combines the modification value with the current value of the indicator, which, as described above, is "½" during the first iteration. During step 110, the microcontroller module 20 determines the modification value as $$(-1)^{b_{i+1}}\left(\frac{1}{2}\right)^{msb-i+1},$$

and during step 110, it subtracts the modification value from the current value of the indicator. For the modification value, the factor $$\left(\frac{1}{2}\right)^{msb-i+1}$$

will provide that the value of the current voltage range level indicator will be modified by a differential amount corresponding to the appropriate power of "½." For example, as indicated above, during the first iteration, the value of the current voltage range level indicator is "½" thereby providing that the voltage level of the LS_CORR_L left channel level shift correction signal will be at ½V vDC. As further indicated above, during the second iteration, the voltage level of the LS_CORR_L signal will be either at ¼ V vDC or at ¾ V vDC, which, as will be made apparent below, will require a modification value of either "¼" or "−¼." Since the value was "i" of decremented in step 107, during step 110 of the first iteration the value of "i" corresponds to "msb−1," in which case the value of the exponent "msb-i+1" corresponds to "msb−(msb−1)+1", which, in turn, corresponds to "2." Since (½)² equals "¼," it will be apparent that the factor $$\left(\frac{1}{2}\right)^{msb-i+1}$$

will provide the appropriate differential amount for the modification of the current voltage range level indicator for use during the second iteration. Since, for each subsequent iteration, the value of the iteration counter "i" will be further reduced from "msb," thereby causing the value of the exponent to be increased, it will be further apparent that the factor will also provide the appropriate differential amounts ("⅛," "1/16," and so forth) for use during each subsequent (third, fourth, and so forth) iteration.

Continuing with the modification value $$(-1)^{b_{i+1}}\left(\frac{1}{2}\right)^{msb-i+1},$$

the factor $(-1)^{b_{i+1}}$ determines the sign of the modification value. As noted above, "$b_{i+1}$" corresponds to the value of the bit in bit position $B_{i+1}$. Since, as further noted above, the value of "i" was decremented in step 107, during step 110 of the first iteration the value of "i" corresponds to "msb−1," in which case the index "i+1" corresponds to "msb." In that case, the factor $(-1)^{b_{i+1}}$ provides that the modification value will be positive if the value of the bit in bit position $B_{msb}$ is "zero" (that is, if the bit is clear, which will be the case if the bit was not set in step 106), and negative if the value of the bit in bit position is "one" (that is, if the bit is set, which will be the case if the bit was set in step 106).

After the microcontroller module 20 has determined the modification value (step 110), it will subtract the modification value from the current value of the current voltage range level indicator (step 111). Thus, during the first iteration, if the bit in bit position $B_{msb}$ is set, the microcontroller module 20 will subtract the value "−¼" from "½," the current value of the current voltage range level indicator, thereby to indicate the appropriate voltage level, ¾ V vDC, for the LS_CORR_L left channel level shift correction signal for use during the next iteration. On the other hand, if the bit in bit position $B_{msb}$ is clear, the microcontroller module 20 will subtract the value "¼" from "½," the current value of the current voltage range level indicator, thereby to indicate the appropriate voltage level, ¼ V vDC, for the LS_CORR_L left channel level shift correction signal for use during the next iteration.

Following step 111, the microcontroller module 20 returns to step 103 to begin another iteration to determine whether the bit in bit position $B_{msb-1}$ is to be set or remain clear. In the second iteration, the microcontroller module 20 initially (step 103) sets the voltage level of the LS_CORR_L left channel correction signal to the level indicated by the value of the current voltage range level indicator, as determined in step 111 of the previous iteration. Accordingly, the microcontroller module 20 will set the voltage level of the LS_CORR_L signal to ¾ V vDC if the bit in bit position $B_{msb}$ was set in the previous iteration, or to ¼ V vDC if the bit in bit position $B_{msb}$ was allowed to remain clear. In addition, the microcontroller module 20 will determine the condition of the DC_OFFSET_CORR_L left channel DC offset correction signal generated by the comparator 51L (steps 104 and 105), condition the bit in bit position $B_{msb-1}$ accordingly (step 106), decrement the value of the iteration counter "i" (step 107) and determine whether another iteration is to be performed (reference step 108). If the microcontroller module 20 determines that another iteration is to be performed, it updates the value of the current voltage range level indicator (steps 110 and 111) and again returns to step 103 to perform another iteration.

The microcontroller module 20 will perform the operations described above in connection with steps 103 through 108, 110 and 111, until it determines in step 108 that the value of the iteration counter "i" is not greater than or equal to "zero." At that point, the microcontroller module 20 will have conditioned the bits in all of the bit positions $B_{msb} \ldots B_0$, and at that point it sequences to step1 12 to store the value represented by the bits in the left channel power on level shift value store 22L.

As noted above, the microcontroller module 20 will perform similar operations as those described above, in connection with the DC offset determination module 21R, DC_OFFSET_CORR_R signal, LS_CORR_R signal, and AUD_R_OUT_a and AUD_R_OUT_b signals (the latter not shown) to generate the right channel power on level shift value for storage in the store 22R. It will be appreciated that, since the microcontroller module 20 determines the power-on level-shift values are determined for the left and right channels separately, the values for the different channels may differ. After the microcontroller module 20 has determined both the left and right channel power-on level-shift values and stored them in respective stores 22L and 22R, it has completed the calibration operation. Thereafter, the microcontroller module 20 can use the power-on level-shift values stored in the stores 22L and 22R to set the voltage levels of the LS_CORR_L and LS_CORR_R left and right channel level-shift correction signals when the audio amplifier system 10 is powered-on.

The invention provides a number of advantages. In particular, the invention provides an arrangement for use with an audio amplifier to generate an output signal to have a minimal, and possibly zero, DC offset when the audio amplifier is powered on. It will be appreciated that the output signal may not have an exactly zero-DC offset when it is powered on, but whatever residual offset that may exist will be minimized. As a result, the invention enables the audio amplifier to minimize, and possibly eliminate, annoying noises that might otherwise be generated when the amplifier is initially powered on, as well as the likelihood of damage to components, such as speakers, that receive the AUD_L_OUT and AUD_R_OUT left and right channel audio output signals from the audio amplifier system 10.

It will be appreciated that, although the microcontroller module 20 has been described as using the power-on level shift values stored in stores 22L and 22R to determine voltage levels of the LS_CORR_L and LS_CORR_R left and right channel level-shift correction signals for use when the audio amplifier system 10 is initially powered on, it will be appreciated that the microcontroller module 20 may also continue generating the LS_CORR_L and LS_CORR_R signals at the same voltage level while the audio amplifier system 10 remains powered on.

It will be appreciated that numerous changes and modifications may be made to the amplifier described above in connection with FIGS. 1A through 4. For example, although the audio amplifier system 10 has been described as making use of power amplifiers of generally the class-D design, it will be appreciated that the system 10 may make use of power amplifiers of other class designs, including, for example, amplifiers generally of class-A, class-B, class-AB and class-C designs. In addition, the system 10 may find utility in connection with power amplifiers generally of designs that have yet to be developed. It will be appreciated that, if the audio amplifier system 10 makes use of power amplifiers that do not make use of high-frequency components such as are used in connection with class-D audio amplifiers, low-pass filters may not be required.

In addition, it will be appreciated that the particular manner in which the microcontroller module 20 can generate the LS_CORR_L and LS_CORR_R left and right channel level-shift correction signal at particular voltage levels using any convenient methodology. In one particular embodiment, the microcontroller module 20 generates each signal by initially generating a respective pulse-width-modulated ("PWM") signal of a selected amplitude and duty cycle. Each respective PWM signal is low-pass filtered, and the respective low-pass-filtered signal constitutes the associated LS_CORR_L or LS_CORR_R signal. For each signal, the duty cycle corresponds to the value of the power-on level-shift value stored in the respective store 22L, 22R, and determines the voltage level of the respective LS_CORR_L, LS_CORR_R signal. Thus, if, for example, the duty cycle is 50%, the voltage level of the respective LS_CORR_L, LS_CORR_R signal will be ½V vDC, the midpoint of the 0 vDC to V vDC range. Similarly, if the duty cycle is 0%, the voltage level of the respective signal will be the low-point 0 vDC of the range, and if the duty cycle is 100% the voltage level of the respective signal will be the high-point V vDC of the range. In that case, it will be appreciated that the binary-encoded value of the power-on level shift value stored in the respective store 22L, 22R corresponds to the duty cycle of the PWM signal that the microcontroller module 20 will generate for the respective LS_CORR_L, LS_CORR_R signal.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

What is claimed as new and desired to be secured by Letters Patent of the United States is:

1. An amplifier system for receiving an input signal and generating therefrom an amplified output signal, the amplifier system comprising: A. an input stage configured to receive the input signal and provide a level-shifted signal that has an average signal level that is shifted in regards a level shift value; and B. an amplifier stage configured to receive the level-shifted input signal from the input stage and generate therefrom the amplified output signal, the level shift value being selected to minimize a DC offset in the amplified output signal at least when the amplifier system is initially powered on and further including a level shift value generator module configured to generate the level shift value;
   in which the level shift value comprises a series of digits, from a most significant digit position to a least significant digit position, the level shift value generator module being configured to determine digit values for the respective digit positions in a series of iterations, wherein
   A. the input stage comprises:
   i. a level shift value store configured to store the level shift value, the level shift value store comprising a series of digit stores each configured to store one of the digit values,
   ii. a level shift signal generator configured to generate a level shift signal having a level reflective of the level shift value, and
   iii. a signal combiner module configured to combine the level shift signal and the input signal thereby to generate the level-shifted signal;
   B. the level shift value generator module comprises:
   i. a level shift signal generator controller module configured to enable the level shift generator to generate a level shift signal having a selected incremental level;
   ii. a digit value generator module configured to generate a value for a digit as a function of a relation between the level of the amplified output signal and a selected reference level, the value being stored in a selected digit store in the level shift value store; and
   iii. a level shift value generation control module configured to control the level shift signal generator and the digit value generator module through a series of iterations during a level shift value generation operation to facilitate generation of the successive digits of the level shift value.

2. An amplifier system as defined in claim 1 in which the selected DC offset is selected to minimize the DC offset in the amplified output signal at least when the amplifier system is initially powered on.

3. An amplifier system as defined in claim 1 in which the input signal and amplified output signal represent audio information.

4. An amplifier system as defined in claim 1 in which the level shift value generator module is configured to generate the level shift value in relation to a predetermined input signal.

5. An amplifier system as defined in claim 4 in which the predetermined input signal is a level signal having a predetermined level.

6. An amplifier system as defined in claim 1 in which the level shift value generation control module is further configured to provide an input signal having a selected input signal level during the level shift Value generation operation.

7. An amplifier system as defined in claim 1 further comprising a comparator configured to generate a comparison signal reflecting the relation between the level of the amplified output signal and a selected reference level, the digit value generator module being configured to generate the value for the digit in relation to the comparison signal.

8. An amplifier system as defined in claim 7 in which the amplified output signal is a differential signal having two signal portions, the comparator being configured to generate the comparison signal in relation to the signal portions of the differential signal.

9. An amplification method as defined in claim 1 in which the level shift value generation step includes the step of generating the level shift value in relation to a predetermined input signal.

10. An amplification step as defined in claim 9 in which level shift value generation step includes the step of providing that the predetermined input signal is a level signal having a predetermined level.

11. An amplification method for receiving an input signal and generating therefrom an amplified output signal, the amplification method comprising:
    A. an input step of receiving the input signal and providing a level-shifted signal that has an average signal level that is shifted in regards a level shift value; and
    B. an amplification step of receiving the level-shifted input signal and generating therefrom the amplified output signal, the level shift value being selected to provide a selected DC offset in the amplified output signal at least when the amplifier system is initially powered on;
    further including a level shift value generation step of generating the level shift value;
    in which the level shift value comprises a series of digits, from a most significant digit position to a least significant digit position, the level shift value generation step including the step of determining digit values for the respective digit positions in a series of iterations; in which
    A. the input step includes:
    i. a level shift signal generation step of generating a level shift signal having a level reflective of the level shift value, the level shift value being stored in a level shift value store configured to store the level shift value, the level shift value store comprising a series of digit stores each configured to store one of the digit values, and
    ii. a signal combining step of combining the level shift signal and the input signal thereby to generate the level-shifted signal;
    B. the level shift value generation step includes:
    i. a level shift signal generation step of enabling the level shift generator to generate a level shift signal having a selected incremental level;

ii. a digit value generation step of generating a value for a digit as a function of a relation between the level of the amplified output signal and a selected reference level, the value being stored in a selected digit store in the level shift value store; and iii. a level shift value generation control step of controlling the level shift signal generation step and the digit value generation step through a series of iterations during a level shift value generation operation to facilitate generation of the successive digits of the level shift value.

12. An amplification method as defined in claim 11 further comprising a step of selecting the selected DC offset to minimize the DC offset in the amplified output signal at least when the amplifier system is initially powered on.

13. An amplification method as defined in claim 11 in which the input signal and amplified output signal represent audio information.

14. An amplification method as defined in claim 11 in which the level shift value generation control step includes the step of providing an input signal having a selected input signal level during the level shift value generation operation.

15. An amplification method as defined in claim 11 in which the digit value generation step includes a comparison step of generating a comparison signal reflecting the relation between the level of the amplified output signal and a selected reference level, the digit value generation step including the step of generating the value for the digit in relation to the comparison signal.

16. An amplification method as defined in claim 15 in which the amplified output signal is a differential signal having two signal portions, the comparison step including the step of generating the comparison signal in relation to the signal portions of the differential signal.

17. A level shift value generator module for generating a level shift value for use in connection with an amplifier system, the amplifier system being configured to receive an input signal and generate therefrom an amplified output signal, the amplifier system including a level shift value store configured to store the level shift value, the level shift value store comprising a series of digit stores each configured to store one of a series of digit values, a level shift signal generator configured to generate a level shift signal having a level reflective of the level shift value, and a signal combiner module configured to combine the level shift signal and the input signal thereby to generate a level-shifted signal, the level shifted signal being amplified go generate the amplified output signal, the level shift value generator module comprising: A. a level shift signal generator module configured to generate a level shift signal having a selected incremental level; B. a digit value generator module configured to generate a value for a digit as a function of a relation between the level of the amplified output signal and a selected reference level, the value being stored in a selected digit store in the level shift value store; and C a level shift value generation control module configured to control the level shift signal generator and the digit value generator module through a series of iterations during a level shift value generation operation to facilitate generation of the successive digits of the level shift value.

18. A level shift value generator module as defined in claim 17 in which the input signal and amplified output signal represent audio information.

19. A level shift value generator module as defined in claim 17 in which the level shift value generation control module is further configured to provide an input signal having a selected input signal level during the level shift value generation operation.

20. A level shift value generator module as defined in claim 17 further comprising a comparator configured to generate a comparison signal reflecting the relation between the level of the amplified output signal and a selected reference level, the digit value generator module being configured to generate the value for the digit in relation to the comparison signal.

21. A level shift value generator module as defined in claim 20 in which the amplified output signal is a differential signal having two signal portions, the comparator being configured to generate the comparison signal in relation to the signal portions of the differential signal.

22. A method of generating a level shift value for use in connection with an amplifier system, the amplifier system being configured to receive an input signal and generate therefrom an amplified output signal, the amplifier system including a level shift value store configured to store the level shift value, the level shift value store comprising a series of digit stores each configured to store one of a series of digit values, a level shift signal generator configured to generate a level shift signal having a level reflective of the level shift value, and a signal combiner module configured to combine the level shift signal and the input signal thereby to generate a level-shifted signal, the level shifted signal being amplified go generate the amplified output signal, the method comprising the steps of: A. a level shift signal generation step of generating a level shift signal having a selected incremental level; B. a digit value generation step of generating a value for a digit as a function of a relation between the level of the amplified output signal and a selected reference level, the value being stored in a selected digit store in the level shift value store; and C a level shift value generation control step of enabling the level shift signal generation step and the digit value generation step through a series of iterations during a level shift value generation operation to facilitate generation of the successive digits of the level shift value.

23. A method as defined in claim 22 in which the input signal and amplified output signal represent audio information.

24. A method as defined in claim 22 in which the level shift value generation control step includes the step of providing an input signal having a selected input signal level during the level shift value generation operation.

25. A method as defined in claim 22 in which the digit value generation step includes a comparison step of generating a comparison signal reflecting the relation between the level of the amplified output signal and a selected reference level, the digit value generation step including the step of generating the value for the digit in relation to the comparison signal.

26. A method as defined in claim 25 in which the amplified output signal is a differential signal having two signal portions, the comparison step including the step of generating the comparison signal in relation to the signal portions of the differential signal.

27. A computer program product for use in connection with a computer and an amplifier system for generating a level shift value for use in connection with the amplifier system, the amplifier system being configured to receive an input signal and generate therefrom an amplified output signal, the amplifier system including a level shift value store configured to store the level shift value, the level shift value store comprising a series of digit stores each configured to store one of a series of digit values, a level shift signal generator configured to generate a level shift signal having a level reflective of the level shift value, and a signal combiner module configured to combine the level shift signal and the input signal thereby to generate a level-shifted signal, the level shifted signal being amplified go generate the amplified output signal, the computer program product comprising a computer readable medium having encoded thereon: A. a level shift signal generator module configured to enable the computer to enable the amplifier system to generate a level shift signal having a selected incremental level; B. a digit value generator module configured to enable the computer to generate a value for a digit as a function of a relation between the level of the amplified output signal and a selected reference level, the value being stored in a selected digit store in the level shift value store; and C a level shift value generation control module configured to control the level shift signal generator and the digit value generator module through a series of iterations during a level shift value generation operation to facilitate generation of the successive digits of the level shift value.

28. A computer program product as defined in claim 27 in which the input signal and amplified output signal represent audio information.

29. A computer program product as defined in claim 27 in which the level shift value generation control module is further configured to enable the computer enable the amplifier system to provide an input signal having a selected input signal level during the level shift value generation operation.

30. A computer program product as defined in claim 27 further comprising a comparator module configured to enable the computer to receive a comparison signal reflecting the relation between the level of the amplified output signal and a selected reference level, the digit value generator module being configured to enable the computer to generate the value for the digit in relation to the comparison signal.

31. A computer program product as defined in claim 30 in which the amplified output signal is a differential signal having two signal portions, the comparator module being configured to enable the computer to receive the comparison signal in relation to the signal portions of the differential signal.

\* \* \* \* \*